(12) United States Patent
Zhu (10) Patent No.: US 12,395,061 B2
(45) Date of Patent: Aug. 19, 2025

(54) CONTROLLERS CONFIGURED TO DETECT DEMAGNETIZATION WITH EXTERNAL BIPOLAR TRANSISTORS AND INTERNAL MOS TRANSISTORS AND METHODS THEREOF

(71) Applicant: ON-BRIGHT ELECTRONICS (SHANGHAI) CO., LTD., Shanghai (CN)

(72) Inventor: Liqiang Zhu, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 343 days.

(21) Appl. No.: 18/074,215

(22) Filed: Dec. 2, 2022

(65) Prior Publication Data

US 2023/0179084 A1 Jun. 8, 2023

(30) Foreign Application Priority Data

Dec. 6, 2021 (CN) .......................... 202111476147.4

(51) Int. Cl.
*H02M 3/335* (2006.01)
*G01R 33/12* (2006.01)
(Continued)

(52) U.S. Cl.
CPC ........ *H02M 1/088* (2013.01); *G01R 33/1215* (2013.01); *H02M 1/0012* (2021.05);
(Continued)

(58) Field of Classification Search
CPC ............. H02M 1/0003; H02M 1/0012; H02M 1/0058; H02M 1/08; H02M 1/088;
(Continued)

(56) References Cited

U.S. PATENT DOCUMENTS

| 2012/0075891 A1* | 3/2012 | Zhang | H02M 1/08 363/21.18 |
| 2013/0119881 A1* | 5/2013 | Fang | H05B 45/14 315/210 |

(Continued)

FOREIGN PATENT DOCUMENTS

| CN | 102983760 A | 3/2013 |
| CN | 104166107 A | 11/2014 |

(Continued)

OTHER PUBLICATIONS

Taiwan Intellectual Property Office, Office Action issued Sep. 8, 2022, in Application No. 111104944.

(Continued)

*Primary Examiner* — Thienvu V Tran
*Assistant Examiner* — Shahzeb K Ahmad
(74) *Attorney, Agent, or Firm* — Faegre Drinker Biddle & Reath LLP (57) ABSTRACT

Controller and method for power converter. For example, a controller for a power converter includes: a first driver configured to generate a drive current and output the drive current to a first terminal of a first transistor, the first transistor further including a second terminal and a third terminal; a second driver configured to generate a drive voltage and output the drive voltage to a fourth terminal of a second transistor, the second transistor further including a fifth terminal and a sixth terminal; a demagnetization detector configured to receive a first voltage of the first terminal of the first transistor and generate a detection signal based at least in part on the first voltage; and a control signal generator configured to receive the detection signal and generate a first control signal and a second control signal based at least in part on the detection signal.

23 Claims, 4 Drawing Sheets

(51) Int. Cl.
*H02M 1/00* (2007.01)
*H02M 1/08* (2006.01)
*H02M 1/088* (2006.01)
*H02M 3/158* (2006.01)
*H03K 17/082* (2006.01)
*H02M 7/21* (2006.01)

(52) U.S. Cl.
CPC ........... *H02M 1/0058* (2021.05); *H02M 1/08* (2013.01); *H02M 3/1582* (2013.01); *H02M 3/335* (2013.01); *H03K 17/0822* (2013.01); *H02M 7/21* (2013.01)

(58) Field of Classification Search
CPC ........ H02M 1/40; H02M 3/156; H02M 3/158; H02M 3/1582; H02M 3/1584; H02M 3/335; H02M 3/33507; H02M 3/33576; H02M 3/33569; H02M 3/33571; H02M 7/21; H02M 7/217; H02M 7/219; H02M 7/155; G01R 33/1215; H03K 17/0822
See application file for complete search history.

(56) References Cited

U.S. PATENT DOCUMENTS

| | | | |
|---|---|---|---|
| 2015/0162820 A1* | 6/2015 | Zhang | H02M 3/33507 363/21.16 |
| 2016/0255685 A1* | 9/2016 | Melanson | H05B 47/10 327/109 |
| 2017/0222561 A1* | 8/2017 | Ivankovic | H02M 1/44 |
| 2018/0131284 A1* | 5/2018 | Fang | H02M 3/33523 |
| 2023/0336076 A1* | 10/2023 | Fang | H05B 45/3725 |

FOREIGN PATENT DOCUMENTS

| | | | |
|---|---|---|---|
| CN | 104467373 A | | 3/2015 |
| CN | 107317491 A | | 11/2017 |
| CN | 108880296 A | | 11/2018 |
| CN | 111030481 A | * | 4/2020 |
| CN | 112838772 A | | 5/2021 |
| CN | 113131731 A | | 7/2021 |
| CN | 214591137 U | | 11/2021 |
| TW | 202002480 A | | 1/2020 |

OTHER PUBLICATIONS

China Intellectual Property Office, Office Action issued May 29, 2023, in Application No. 202111476147.4.
China Intellectual Property Office, Office Action issued Oct. 27, 2023, in Application No. 202111476147.4.

* cited by examiner

CONTROLLERS CONFIGURED TO DETECT DEMAGNETIZATION WITH EXTERNAL BIPOLAR TRANSISTORS AND INTERNAL MOS TRANSISTORS AND METHODS THEREOF

1. CROSS-REFERENCES TO RELATED APPLICATIONS

This application claims priority to Chinese Patent Application No. 202111476147.4, filed Dec. 6, 2021, incorporated by reference herein for all purposes.

2. BACKGROUND OF THE INVENTION

Certain embodiments of the present invention are directed to circuits. More particularly, some embodiments of the invention provide controllers configured to detect demagnetization with external bipolar transistors and internal MOS transistors and methods thereof. Merely by way of example, some embodiments of the invention have been applied to switch-mode power converters for light emitting diodes. But it would be recognized that the invention has a much broader range of applicability.

The power converters can convert electric power from one form to another form. As an example, the electric power is transformed from alternate current (AC) to direct current (DC), from DC to AC, from AC to AC, or from DC to DC. Additionally, the power converters can convert the electric power from one voltage level to another voltage level. The power converters include linear converters and switch-mode converters.

Switch-mode power converters are often used as power supply devices because of their high efficiency, low cost and/or small size. The power supply devices usually include power adapters, chargers, and/or inverters for various systems, such as light emitting diode (LED) lighting systems. The switch-mode converters often are implemented with various architectures, such as the fly-back architecture, the buck architecture, and/or the boost architecture. As part of normal operation, the switch-mode power converters usually need to detect the end of a demagnetization process of certain magnetic components (e.g., transformers and/or inductors). Such detection is often used to achieve the quasi-resonant control, the constant voltage and/or the constant current control.

Figure 1:
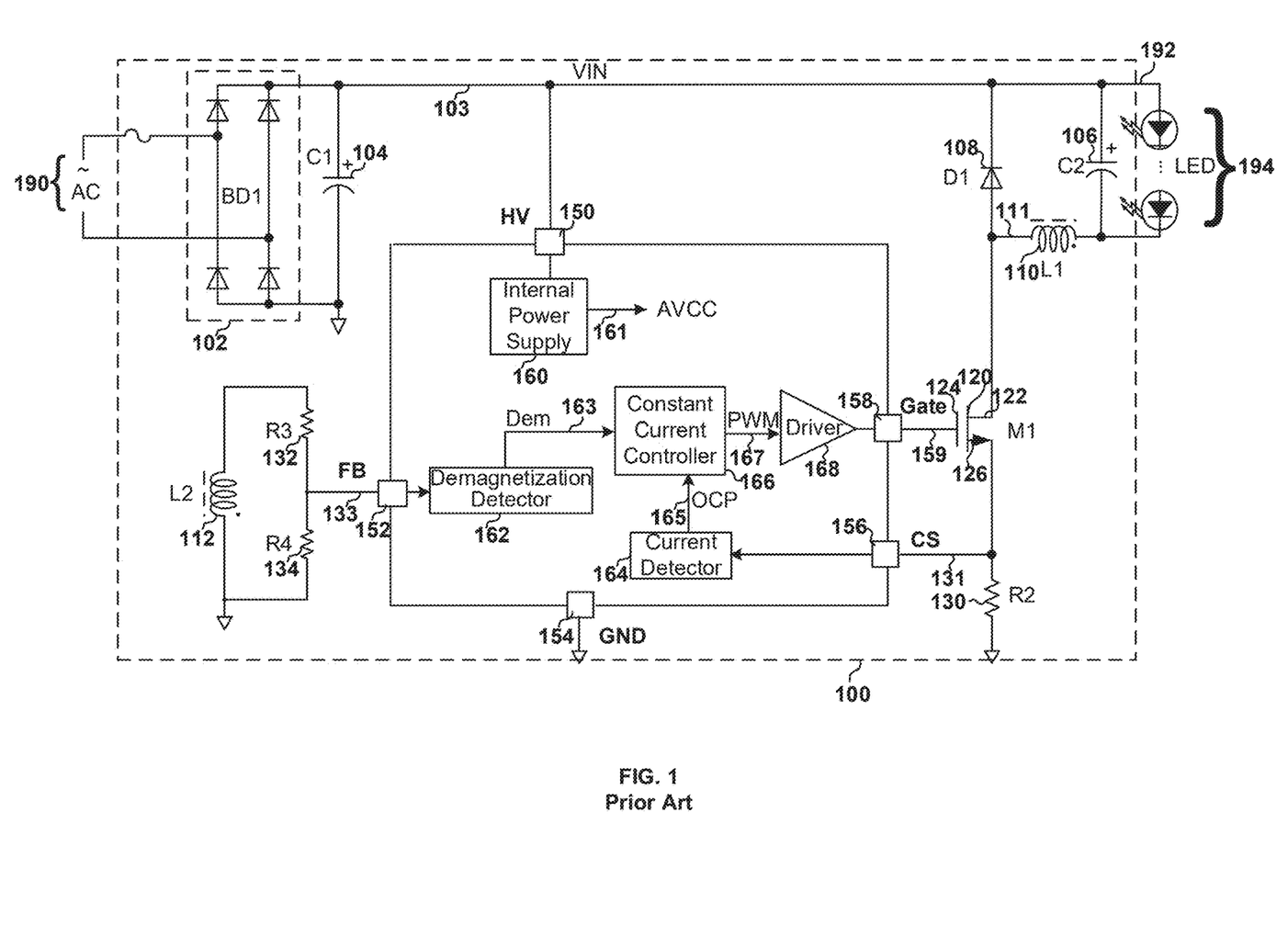
FIG. 1 is a simplified diagram showing a conventional switch-mode power converter for light emitting diodes.

FIG. 1 is a simplified diagram showing a conventional switch-mode power converter for light emitting diodes. The conventional switch-mode power converter 100 includes a rectifier 102, an input capacitor 104, an output capacitor 106, a diode 108, inductors 110 and 112, a switch 120, resistors 130, 132 and 134, and a controller 140. For example, the inductor 110 (e.g., L1) and the inductor 112 (e.g., L2) are coupled to each other. As an example, the switch 120 is a transistor (e.g., a power transistor). As an example, the resistor 130 (e.g., R2), the transistor 132 (e.g., R3), and the transistor 134 (e.g., R4) are used for current detection.

As shown in FIG. 1, the conventional switch-mode power converter 100 receives an AC input voltage 190 and generates an output current 192 that is received by one or more light emitting diodes 194. For example, the conventional switch-mode power converter 100 uses a BUCK architecture. As an example, the conventional switch-mode power converter 100 regulates the output current 192 to control the brightness of the one or more light emitting diodes 194.

The controller 140 (e.g., a chip) includes terminals (e.g., pins) 150, 152, 154, 156, and 158. The terminal 150 (e.g., the HV pin) receives a rectified voltage 103 (e.g., VIN), the terminal 152 (e.g., the FB pin) receives a feedback voltage 133, the terminal 154 (e.g., the GND pin) receives a ground voltage, the terminal 156 (e.g., the CS pin) receives a sensing voltage 131, and the terminal 158 (e.g., the Gate pin) outputs a drive signal 159 (e.g., a drive voltage). For example, the inductor 112 (e.g., L2), the transistor 132 (e.g., R3), and the transistor 134 (e.g., R4) are parts of a circuit for demagnetization detection. One terminal of the transistor 132 (e.g., R3) and one terminal of the transistor 134 (e.g., R4) are connected to each other to generate the feedback voltage 133. As an example, the transistor 120 (e.g., M1) includes a drain terminal 122, a gate terminal 124, and a source terminal 126. The gate terminal 124 receives the drive signal 159 (e.g., a drive voltage). The source terminal 126 is connected to one terminal of the resistor 130 to generate the sensing voltage 131, and another terminal of the resistor 130 is biased to the ground voltage.

Additionally, the controller 140 (e.g., a chip) includes an internal power supply 160, a demagnetization detector 162, a current detector 164, a constant current controller 166, and a driver 168. In some examples, the internal power supply 160 receives the rectified voltage 103 (e.g., VIN) through the terminal 150 (e.g., the HV pin) and generates an internal supply voltage 161 (e.g., AVCC) based at least in part on the rectified voltage 103 (e.g., VIN). If the internal supply voltage 161 (e.g., AVCC) becomes higher than a start-up voltage threshold of the controller 140 (e.g., a chip), the controller 140 (e.g., a chip) starts powering up. In certain examples, the demagnetization detector 162 receives the feedback voltage 133 from the terminal 152 (e.g., the FB pin) and generates a demagnetization signal 163 (e.g., Dem) based at least in part on the feedback voltage 133.

In some examples, the current detector 164 receives the sensing voltage 131 through the terminal 156 (e.g., the CS pin) and generates a detection signal 165 based at least in part on the sensing voltage 131. For example, the detection signal 165 represents a peak magnitude of a current 111 that flows through the inductor 110 (e.g., L1). In certain examples, the constant current controller 166 receives the demagnetization signal 163 (e.g., Dem) and the detection signal 165 and generates a control signal 167 based at least in part on the demagnetization signal 163 (e.g., Dem) and the detection signal 165. For example, the control signal 167 is a pulse-width-modulation (PWM) signal. In some examples, the driver 168 receives the control signal 167 (e.g., a PWM signal) and generates the drive signal 159 (e.g., a drive voltage) based at least in part on the control signal 167. For example, the drive signal 159 (e.g., a drive voltage) is received by the gate terminal 124 through the terminal 158 (e.g., the Gate pin). As an example, the drive signal 159 (e.g., a drive voltage) is used to regulate the output current 192 in order to keep the output current 192 at a constant magnitude.

Hence it is highly desirable to improve the technique for switch-mode power converters.

3. BRIEF SUMMARY OF THE INVENTION

Certain embodiments of the present invention are directed to circuits. More particularly, some embodiments of the invention provide controllers configured to detect demagnetization with external bipolar transistors and internal MOS transistors and methods thereof. Merely by way of example, some embodiments of the invention have been applied to switch-mode power converters for light emitting diodes. But it would be recognized that the invention has a much broader range of applicability.

According to some embodiments, a controller for a power converter includes: a first driver configured to generate a drive current and output the drive current to a first terminal of a first transistor, the first transistor further including a second terminal and a third terminal; a second driver configured to generate a drive voltage and output the drive voltage to a fourth terminal of a second transistor, the second transistor further including a fifth terminal and a sixth terminal; a demagnetization detector configured to receive a first voltage of the first terminal of the first transistor and generate a detection signal based at least in part on the first voltage; and a control signal generator configured to receive the detection signal and generate a first control signal and a second control signal based at least in part on the detection signal; wherein the demagnetization detector is further configured to change the detection signal from a first logic level to a second logic level based at least in part on the first voltage; wherein: the first driver is further configured to receive the first control signal and generate the drive current based at least in part on the first control signal; and the gate driver is further configured to receive the second control signal and generate the drive voltage based at least in part on the second control signal.

According to certain embodiments, a controller for a power converter includes: a first controller terminal configured to output a base current to a base terminal of a bipolar transistor, the bipolar transistor further including a collector terminal and an emitter terminal, the collector terminal being connected to an inductor; a second controller terminal configured to connect the emitter terminal of the bipolar transistor to a drain terminal of a MOS transistor; the MOS transistor further including a gate terminal and a source terminal; a third controller terminal configured to connect the source terminal of the MOS transistor to a resistor; and a demagnetization detector configured to receive a base voltage of the base terminal of the bipolar transistor through the first controller terminal and generate a detection signal based at least in part on the base voltage; wherein the demagnetization detector is further configured to, in response to the base voltage becomes smaller than a reference voltage, change the detection signal from a first logic level to a second logic level to indicate an end of a demagnetization process related to the inductor.

According to some embodiments, a method for a power converter includes: generating a drive current; outputting the drive current to a first terminal of a first transistor, the first transistor further including a second terminal and a third terminal; generating a drive voltage; outputting the drive voltage to a fourth terminal of a second transistor, the second transistor further including a fifth terminal and a sixth terminal; receiving a first voltage of the first terminal of the first transistor; generating a detection signal based at least in part on the first voltage; receiving the detection signal; and generating a first control signal and a second control signal based at least in part on the detection signal; wherein the generating a detection signal based at least in part on the first voltage includes changing the detection signal from a first logic level to a second logic level based at least in part on the first voltage; wherein: the generating a drive current includes generating the drive current based at least in part on the first control signal; and the generating a drive voltage includes generating the drive voltage based at least in part on the second control signal.

Depending upon embodiment, one or more benefits may be achieved. These benefits and various additional objects, features and advantages of the present invention can be fully appreciated with reference to the detailed description and accompanying drawings that follow.

5. DETAILED DESCRIPTION OF THE INVENTION

Certain embodiments of the present invention are directed to circuits. More particularly, some embodiments of the invention provide controllers configured to detect demagnetization with external bipolar transistors and internal MOS transistors and methods thereof. Merely by way of example, some embodiments of the invention have been applied to switch-mode power converters for light emitting diodes. But it would be recognized that the invention has a much broader range of applicability.

As shown in FIG. 1, a high-voltage metal oxide semiconductor (MOS) transistor is used as the switch 120 (e.g., M1), and the inductor 112 (e.g., L2) is used as part of the circuit for demagnetization detection according to some embodiments. For example, the cost of a high-voltage MOS transistor is high. As an example, the circuit for demagnetization detection includes other peripheral components in addition to the inductor 112 (e.g., L2), further increasing the cost and size of the conventional switch-mode power converter 100.

Figure 2:
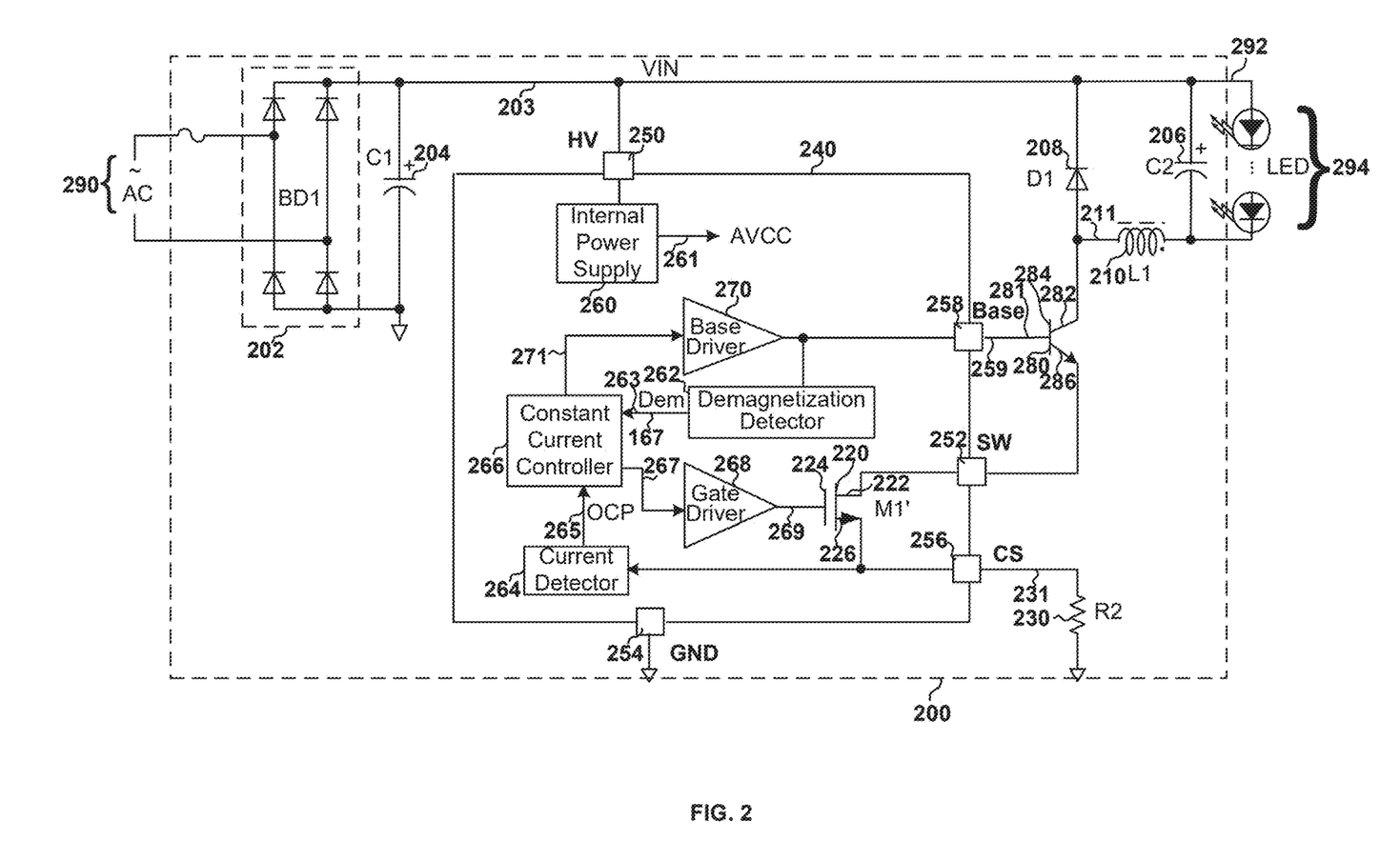
FIG. 2 is a simplified diagram showing a switch-mode power converter for light emitting diodes according to certain embodiments of the present invention.

FIG. 2 is a simplified diagram showing a switch-mode power converter for light emitting diodes according to certain embodiments of the present invention. This diagram is merely an example, which should not unduly limit the scope of the claims. One of ordinary skill in the art would recognize many variations, alternatives, and modifications. The switch-mode power converter 200 includes a rectifier 202, an input capacitor 204, an output capacitor 206, a diode 208, an inductor 210, a transistor 280, a resistor 230, and a controller 240. For example, the transistor 280 is a bipolar transistor (e.g., a high-voltage bipolar transistor). As an example, the high-voltage bipolar transistor 280 can perform normal operation with a voltage that is higher than 300 volts. For example, the resistor 230 (e.g., R2) is used for current detection. Although the above has been shown using a selected group of components for the switch-mode power converter, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 2, the switch-mode power converter 200 receives an AC input voltage 290 and generates an output current 292 that is received by one or more light emitting diodes 294 according to some embodiments. For example, the switch-mode power converter 200 uses a BUCK architecture. As an example, the switch-mode power converter 200 regulates the output current 292 to control the brightness of the one or more light emitting diodes 294.

In certain examples, the controller 240 (e.g., a chip) includes terminals (e.g., pins) 250, 252, 254, 256, and 258. For example, the terminal 250 (e.g., the HV pin) receives a rectified voltage 203 (e.g., VIN), the terminal 254 (e.g., the GND pin) receives a ground voltage, the terminal 256 (e.g., the CS pin) receives a sensing voltage 231, and the terminal 258 (e.g., the Base pin) outputs a drive signal 259 (e.g., a drive current). In some examples, the bipolar transistor 280 (e.g., Q1) includes a collector terminal 282, a base terminal 284, and an emitter terminal 286. For example, the terminal 258 (e.g., the Base pin) outputs the drive signal 259 (e.g., a drive current) to the base terminal 284, and the base terminal 284 receives the drive current 259 as a base current. As an example, the emitter terminal 286 is connected to the terminal 252 (e.g., the SW pin).

According to certain embodiments, the controller 240 (e.g., a chip) includes a switch 220, an internal power supply 260, a demagnetization detector 262, a current detector 264, a constant current controller 266, a gate driver 268, and a base driver 270. For example, the switch 220 is a transistor (e.g., a low-voltage MOS transistor). As an example, the low-voltage MOS transistor 220 can perform normal operation with a voltage that is equal to 5 volts. For example, the transistor 220 (e.g., M1') is an NMOS transistor. In some examples, the transistor 220 (e.g., M1') includes a drain terminal 222, a gate terminal 224, and a source terminal 226. As an example, the drain terminal 222 is connected to the emitter terminal 286 of the bipolar transistor 280 (e.g., Q1) through the terminal 252 (e.g., the SW pin). For example, the source terminal 226 is connected to one terminal of the resistor 230 through the terminal 256 (e.g., the CS pin) to generate the sensing voltage 231, and another terminal of the resistor 230 is biased to the ground voltage. As an example, the gate terminal 224 receives a drive signal 269 (e.g., a drive voltage). In certain examples, the switch 220 is on the chip 240, and the transistor 280 is not on the chip 240.

According to some embodiments, the internal power supply 260 receives the rectified voltage 203 (e.g., VIN) through the terminal 250 (e.g., the HV pin) and generates an internal supply voltage 261 (e.g., AVCC) based at least in part on the rectified voltage 203 (e.g., VIN). For example, if the internal supply voltage 261 (e.g., AVCC) becomes higher than a start-up voltage threshold of the controller 240 (e.g., a chip), the controller 240 (e.g., a chip) starts powering up. In some examples, the current detector 264 receives the sensing voltage 231 through the terminal 256 (e.g., the CS pin) and generates a detection signal 265 based at least in part on the sensing voltage 231. For example, the detection signal 265 represents a peak magnitude of a current 211 that flows through the inductor 210 (e.g., L1). As an example, one terminal of the inductor 210 (e.g., L1) is connected to the collector terminal 282 of the bipolar transistor 280 (e.g., Q1), and another terminal of the inductor 210 (e.g., L1) is connected to one terminal of the output capacitor 206. For example, another terminal of the output capacitor 206 is biased to the rectified voltage 203 (e.g., VIN). In certain examples, the constant current controller 266 receives a demagnetization signal 263 (e.g., Dem) and the detection signal 265 and generates control signals 267 and 271 based at least in part on the demagnetization signal 263 (e.g., Dem) and the detection signal 265. For example, the control signal 267 is a pulse-width-modulation (PWM) signal.

In some examples, the gate driver 268 receives the control signal 267 (e.g., a PWM signal) and generates the drive signal 269 (e.g., a drive voltage) based at least in part on the control signal 267. For example, the drive signal 269 (e.g., a drive voltage) is received by the gate terminal 224. As an example, the drive signal 269 (e.g., a drive voltage) is used as a gate voltage to turn on and/or turn off the MOS transistor 220. In certain examples, the base driver 270 receives the control signal 271 and generates the drive signal 259 (e.g., a drive current) based at least in part on the control signal 271. For example, the drive current 259 is received by the base terminal 284 of the bipolar transistor 280 (e.g., Q1) through the terminal 258 (e.g., the Base pin). As an example, the drive current 259 is used as the base current to turn on and/or turn off the bipolar transistor 280 (e.g., Q1).

In certain embodiments, the demagnetization detector 262 receives a voltage 281 (e.g., a base voltage) of the base terminal 284 of the bipolar transistor 280 (e.g., Q1) through the terminal 258 (e.g., the Base pin) and generates the demagnetization signal 263 (e.g., Dem) based at least in part on the voltage 281. For example, during the demagnetization process of the inductor 210, the transistor 220 (e.g., M1') is turned off by the drive voltage 269 and the bipolar transistor 280 is turned off by the drive current 259. In some examples, the demagnetization detector 262 compares the voltage 281 with a predetermined threshold. For example, if the voltage 281 is smaller than the predetermined threshold, the demagnetization signal 263 (e.g., Dem) is at a logic high level, and if the voltage 281 is equal to or larger than the predetermined threshold, the demagnetization signal 263 (e.g., Dem) is at a logic low level. In certain examples, if the voltage 281 (e.g., a base voltage) becomes smaller than the predetermined threshold, the demagnetization signal 263 (e.g., Dem) changes from the logic low level to the logic high level, indicating the end of the demagnetization process of the inductor 210. As an example, at the end of the demagnetization process of the inductor 210, the demagnetization signal 263 (e.g., Dem) changes from the logic low level to the logic high level.

As discussed above and further emphasized here, FIG. 2 is merely an example, which should not unduly limit the scope of the claims. One of ordinary skill in the art would recognize many variations, alternatives, and modifications. For example, the switch-mode power converter 200 uses a flyback architecture, a boost architecture, and/or a buck-boost architecture.

Figure 3:
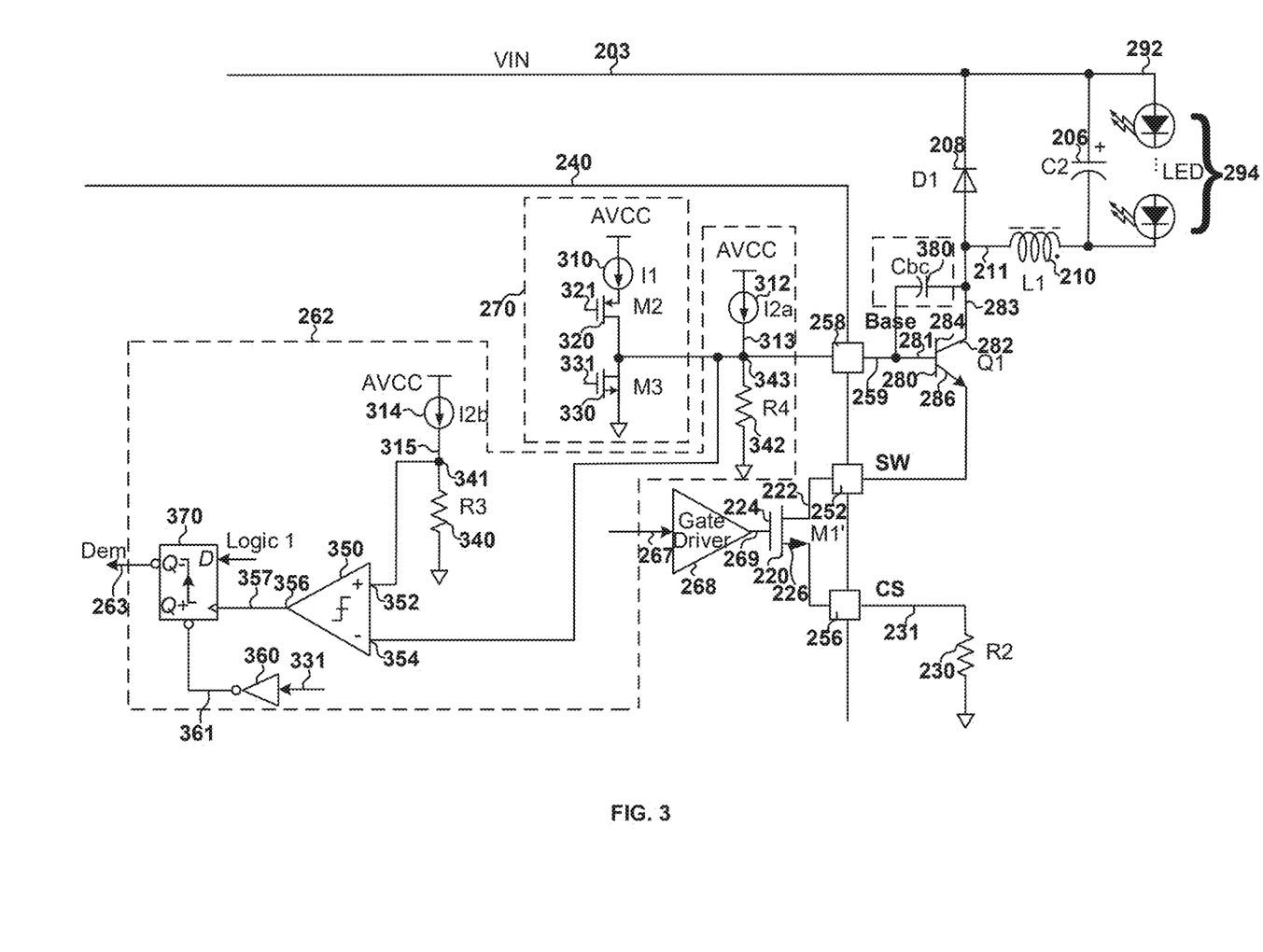
FIG. 3 is a simplified diagram showing certain components of the demagnetization detector and the base driver of the controller as part of the switch-mode power converter as shown in FIG. 2 for light emitting diodes according to some embodiments of the present invention.

FIG. 3 is a simplified diagram showing certain components of the demagnetization detector 262 and the base driver 270 of the controller 240 as part of the switch-mode power converter 200 as shown in FIG. 2 for light emitting diodes according to some embodiments of the present invention. This diagram is merely an example, which should not unduly limit the scope of the claims. One of ordinary skill in the art would recognize many variations, alternatives, and modifications. The base driver 270 includes a current source 310 and switches 320 and 330, and the demagnetization detector 262 includes current sources 312 and 314, resistors 340 and 342, a comparator 350, a NOT gate 360, and a flip-flop 370. For example, the switch 320 is a PMOS transistor (e.g., M2), and the switch 330 is an NMOS transistor (e.g., M3). As an example, the flip-flop 370 is a D flip-flop, whose output signal is the demagnetization signal 263 (e.g., Dem). Although the above has been shown using a selected group of components for the demagnetization detector 262 and the base driver 270, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

According to certain embodiments, during the demagnetization process of the inductor 210, the PMOS transistor 320 (e.g., M2) is turned off by a control signal 321, the NMOS transistor 330 (e.g., M3) is turned off by a control signal 331, the NMOS transistor 220 (e.g., M1') is turned off by the drive voltage 269, and the bipolar transistor 280 is turned off by the drive current 259. In some examples, the current source 312 generates a current 313, and the current source 314 generates a current 315. For example, the magnitude of the current 313 divided by the magnitude of the current 315 is equal to a predetermined ratio. In certain examples, the current 313 flows through the resistor 342 (e.g., R4) to generate a voltage 343, and the current 315 flows through the resistor 340 (e.g., R3) to generate a voltage 341. For example, the voltage 343 is higher than the voltage 341.

In some embodiments, the comparator 350 includes a non-inverting input terminal 352 (e.g., the "+" terminal), an inverting input terminal 354 (e.g., the "−" terminal), and an output terminal 356. For example, the non-inverting input terminal 352 (e.g., the "+" terminal) receives the voltage 341, and the inverting input terminal 354 (e.g., the "−" terminal) receives the voltage 343. As an example, the comparator 350 generates a comparison signal 357 at the output terminal 356. In certain examples, if the voltage 343 is higher than the voltage 341, the comparison signal 357 is at the logic low level. For example, the voltage 343 is the same as the voltage 281 (e.g., a base voltage). As an example, the voltage 341 is used as a predetermined threshold that is compared with the voltage 281 (e.g., a base voltage) of the base terminal 284 of the bipolar transistor 280.

In certain embodiments, during the demagnetization process of the inductor 210, the NMOS transistor 220 (e.g., M1') is turned off by the drive voltage 269 and the bipolar transistor 280 is turned off by the drive current 259. For example, at the end of the demagnetization process of the inductor 210, a voltage 283 at the collector terminal 282 of the bipolar transistor 280 (e.g., Q1) undergoes resonance and through a parasitic capacitor 380 (e.g., Cbc) of the bipolar transistor 280, the voltage 281 of the base terminal 284 also changes. As an example, the voltage 281 of the base terminal 284 is equal to the voltage 343. In some examples, if the voltage 343 (e.g., the voltage 281 of the base terminal 284) becomes lower than the voltage 341, the comparison signal 357 changes from the logic low level to the logic high level. For example, the comparison signal 357 is received by the flip-flop 370, which outputs the demagnetization signal 263 (e.g., Dem). In certain examples, in response to the comparison signal 357 changing from the logic low level to the logic high level, the demagnetization signal 263 (e.g., Dem) changes from the logic low level to the logic high level, indicating the end of the demagnetization process of the inductor 210.

According to some embodiments, the NOT gate 360 receives the control signal 331 and generates a signal 361, which is received by the flip-flop 370. For example, the signal 361 is used to reset the demagnetization signal 263 (e.g., Dem) to the logic low level. According to certain embodiments, the resistance of the resistor 342 (e.g., R4) is much larger than the on resistance of the transistor 330, and the resistance of the resistor 342 (e.g., R4) does not affect the control by the transistor 330 over the voltage 281 of the base terminal 284. For example, the resistance of the resistor 342 (e.g., R4) only slightly affects the power efficiency.

Figure 4:
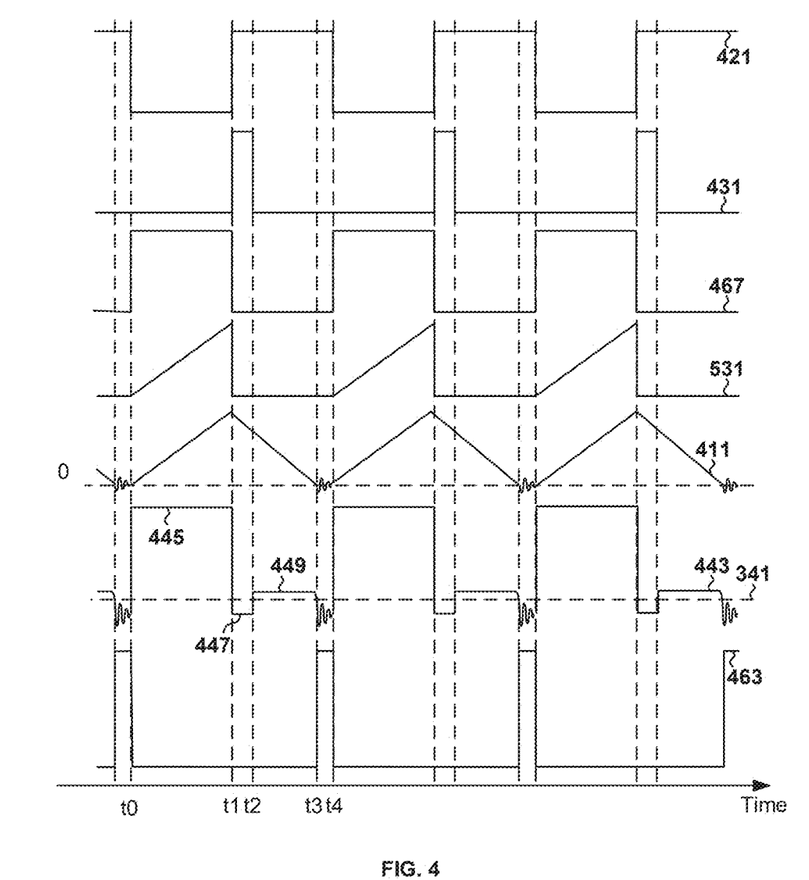
FIG. 4 shows simplified timing diagrams for the switch-mode power converter as shown in FIG. 2 and FIG. 3 according to some embodiments of the present invention.

FIG. 4 shows simplified timing diagrams for the switch-mode power converter 200 as shown in FIG. 2 and FIG. 3 according to some embodiments of the present invention. These diagrams are merely examples, which should not unduly limit the scope of the claims. One of ordinary skill in the art would recognize many variations, alternatives, and modifications. The waveform 421 represents the control signal 321 as a function of time, the waveform 431 represents the control signal 331 as a function of time, the waveform 467 represents the control signal 267 as a function of time, the waveform 531 represents the sensing voltage 231 as a function of time, the waveform 411 represents the current 211 as a function of time, the waveform 443 represents the voltage 343 as a function of time, and the waveform 463 represents the demagnetization signal 263 as a function of time.

From time $t_0$ to time $t_1$, the transistor 220 (e.g., M1') is turned on by the drive voltage 269 and the bipolar transistor 280 is turned on by the drive current 259 according to certain embodiments. As an example, from time $t_0$ to time $t_1$, the control signal 267 is at the logic high level to turn on the transistor 220 (e.g., M1') as shown by the waveform 467. In some examples, from time $t_0$ to time $t_1$, the control signal 321 is at the logic low level to turn on the PMOS transistor 320 as shown by the waveform 421, and the control signal 331 is at the logic low level to turn off the NMOS transistor 330 as shown by the waveform 431. As an example, from time $t_0$ to time $t_1$, the voltage 343 is at a high voltage level 445 as shown by the waveform 443. For example, the high voltage level 445 is higher than the voltage 341. In certain examples, from time $t_0$ to time $t_1$, a current flows from the rectified voltage 203 (e.g., VIN) to the ground voltage through the one or more light emitting diodes 294, the inductor 210 (e.g., L1), the bipolar transistor 280 (e.g., Q1), the transistor 220 (e.g., M1'), and the resistor 230. As an example, from time $t_0$ to time $t_1$, the current 211 that flows through the inductor 210 (e.g., L1) increases with time as shown by the waveform 411. For example, the demagnetization signal 263 (e.g., Dem) remains at the logic low level from time $t_0$ to time $t_1$ as shown by the waveform 463.

From time $t_1$ to time $t_2$, the transistor 220 (e.g., M1') is turned off by the drive voltage 269 and the bipolar transistor 280 is turned off by the drive current 259 according to some embodiments. As an example, from time $t_1$ to time $t_2$, the control signal 267 is at the logic low level to turn off the transistor 220 (e.g., M1') as shown by the waveform 467. In certain examples, from time $t_1$ to time $t_2$, the control signal 321 is at the logic high level to turn off the PMOS transistor 320 as shown by the waveform 421, and the control signal 331 is at the logic high level to turn on the NMOS transistor 330 as shown by the waveform 431. As an example, from time $t_1$ to time $t_2$, the voltage 343 is at a low voltage level 447 as shown by the waveform 443. For example, the low voltage level 447 is lower than the voltage 341. In some examples, from time $t_1$ to time $t_2$, the current 211 flows through the diode 208, one or more light emitting diodes 294, and the inductor 210 (e.g., L1). As an example, from time $t_1$ to time $t_2$, the current 211 decreases with time as shown by the waveform 411. For example, the demagnetization signal 263 (e.g., Dem) remains at the logic low level from time $t_1$ to time $t_2$ as shown by the waveform 463.

From time $t_2$ to time $t_3$, the transistor 220 (e.g., M1') is turned off by the drive voltage 269 and the bipolar transistor 280 is turned off by the drive current 259 according to certain embodiments. As an example, from time $t_2$ to time $t_3$, the control signal 267 is at the logic low level to turn off the transistor 220 (e.g., M1') as shown by the waveform 467. In some examples, from time $t_2$ to time $t_3$, the control signal 321 is at the logic high level to turn off the PMOS transistor 320 as shown by the waveform 421, and the control signal 331 is at the logic low level to turn off the NMOS transistor 330 as shown by the waveform 431. As an example, from time $t_2$ to time $t_3$, the voltage 343 is at an intermediate voltage level 449 as shown by the waveform 443. For example, the intermediate voltage level 449 is lower than the high voltage level 445 but is higher than the voltage 341. As an example, the intermediate voltage level 449 is equal to the current 313 multiplied by the resistance of the resistor 342 (e.g., R4). In certain examples, from time $t_2$ to time $t_3$, the current 211 flows through the diode 208, one or more light emitting diodes 294, and the inductor 210 (e.g., L1). As an example, from time $t_2$ to time $t_3$, the current 211 decreases with time as shown by the waveform 411. For example, when the current 211 decreases to zero, the voltage 283 at the collector terminal 282 of the bipolar transistor 280 (e.g., Q1) starts undergoing resonance and through the parasitic capacitor 380 (e.g., Cbc) of the bipolar transistor 280, the voltage 281 of the base terminal 284, which is equal to the voltage 343, also starts changing as shown by the waveform 443.

At time $t_3$, the voltage 343 becomes smaller than the voltage 341 as shown by the waveform 443, the comparison signal 357 changes from the logic low level to the logic high level, and the demagnetization signal 263 (e.g., Dem) changes from the logic low level to the logic high level as shown by the waveform 463 according to some embodiments. For example, the demagnetization process of the inductor 210 ends at time $t_3$, as indicated by the demagnetization signal 263 (e.g., Dem) changing from the logic low level to the logic high level.

From time $t_3$ to time $t_4$, the demagnetization signal 263 (e.g., Dem) remains at the logic high level, the transistor 220 (e.g., M1') remains turned off by the drive voltage 269, and the bipolar transistor 280 remains turned off by the drive current 259 according to certain embodiments.

At time $t_4$, the transistor 220 (e.g., M1') becomes turned on by the drive voltage 269, and the bipolar transistor 280 becomes turned on by the drive current 259 according to some embodiments.

Certain embodiments of the present invention provide a controller (e.g., a chip) as part of a switch-mode power converter. For example, the controller (e.g., a chip) uses its internal components to detect the end of a demagnetization process without relying on extra components that are external to the controller (e.g., a chip). As an example, the switch-mode power converter uses a high-voltage bipolar transistor external to the controller (e.g., a chip) and a low-voltage MOS transistor internal to the controller (e.g., chip), instead of a high-voltage MOS transistor, thus lowering costs of the switch-mode power converter.

According to some embodiments, a controller for a power converter includes: a first driver configured to generate a drive current and output the drive current to a first terminal of a first transistor, the first transistor further including a second terminal and a third terminal; a second driver configured to generate a drive voltage and output the drive voltage to a fourth terminal of a second transistor, the second transistor further including a fifth terminal and a sixth terminal; a demagnetization detector configured to receive a first voltage of the first terminal of the first transistor and generate a detection signal based at least in part on the first voltage; and a control signal generator configured to receive the detection signal and generate a first control signal and a second control signal based at least in part on the detection signal; wherein the demagnetization detector is further configured to change the detection signal from a first logic level to a second logic level based at least in part on the first voltage; wherein: the first driver is further configured to receive the first control signal and generate the drive current based at least in part on the first control signal; and the gate driver is further configured to receive the second control signal and generate the drive voltage based at least in part on the second control signal. For example, the controller is implemented according to at least FIG. 2.

As an example, the first driver is further configured to output the drive current to turn on or turn off the first transistor; and the second driver is further configured to output the drive voltage to turn on or turn off the second transistor. For example, the first transistor is a bipolar transistor; the first terminal of the first transistor is a base terminal; the second terminal of the first transistor is a collector terminal; the third terminal of the first transistor is an emitter terminal; the drive current is a base current; and the first voltage of the first terminal of the first transistor is a base voltage of the base terminal of the bipolar transistor. As an example, the first driver is further configured to generate the base current and output the base current to the base terminal of the bipolar transistor to turn on or turn off the bipolar transistor.

For example, the second transistor is a MOS transistor; the fourth terminal of the second transistor is a gate terminal; the fifth terminal of the second transistor is a drain terminal; the sixth terminal of the second transistor is a source terminal; and the drive voltage is a gate voltage. As an example, wherein the second driver is further configured to generate the gate voltage and output the gate voltage to the gate terminal of the MOS transistor to turn on or turn off the MOS transistor. For example, the demagnetization detector is further configured to: receive the base voltage of the base terminal of the bipolar transistor; and change the detection signal from the first logic level to the second logic level to indicate an end of a demagnetization process.

As an example, the controller further includes the MOS transistor as the second transistor including the gate terminal, the drain terminal, and the source terminal. For example, the drain terminal of the MOS transistor is connected to the emitter terminal of the bipolar transistor as the first transistor; and the collector terminal of the bipolar transistor is connected to an inductor. As an example, the demagnetization detector is further configured to: receive the base voltage of the base terminal of the bipolar transistor; and change the detection signal from the first logic level to the second logic level to indicate an end of a demagnetization process related to the inductor.

For example, the demagnetization detector is further configured to: in response to the first voltage of the first terminal of the first transistor becoming smaller than a second voltage, change the detection signal from the first logic level to the second logic level to indicate an end of a demagnetization process related to an inductor associated with the first transistor. As an example, the first logic level is a logic low level; and the second logic level is a logic high level.

According to certain embodiments, a controller for a power converter includes: a first controller terminal configured to output a base current to a base terminal of a bipolar transistor, the bipolar transistor further including a collector terminal and an emitter terminal, the collector terminal being connected to an inductor; a second controller terminal configured to connect the emitter terminal of the bipolar transistor to a drain terminal of a MOS transistor; the MOS transistor further including a gate terminal and a source terminal; a third controller terminal configured to connect the source terminal of the MOS transistor to a resistor; and a demagnetization detector configured to receive a base voltage of the base terminal of the bipolar transistor through the first controller terminal and generate a detection signal based at least in part on the base voltage; wherein the demagnetization detector is further configured to, in response to the base voltage becomes smaller than a reference voltage, change the detection signal from a first logic level to a second logic level to indicate an end of a demagnetization process related to the inductor. For example, the controller is implemented according to at least FIG. 2.

As an example, the first controller terminal is further configured to output the base current to the base terminal of the bipolar transistor to turn on or turn off the bipolar transistor. For example, the controller further includes: a base driver configured to generate the base current; a gate driver configured to generate a gate voltage and output the gate voltage to the gate terminal of the MOS transistor; and a control signal generator configured to receive the detection signal and generate a first control signal and a second control signal based at least in part on the detection signal. As an example, the gate driver is further configured to output the gate voltage to the gate terminal of the MOS transistor to turn on or turn off the MOS transistor. For example, the first logic level is a logic low level; and the second logic level is a logic high level.

According to some embodiments, a method for a power converter includes: generating a drive current; outputting the drive current to a first terminal of a first transistor, the first transistor further including a second terminal and a third terminal; generating a drive voltage; outputting the drive voltage to a fourth terminal of a second transistor, the second transistor further including a fifth terminal and a sixth terminal; receiving a first voltage of the first terminal of the first transistor; generating a detection signal based at least in part on the first voltage; receiving the detection signal; and generating a first control signal and a second control signal based at least in part on the detection signal; wherein the generating a detection signal based at least in part on the first voltage includes changing the detection signal from a first logic level to a second logic level based at least in part on the first voltage; wherein: the generating a drive current includes generating the drive current based at least in part on the first control signal; and the generating a drive voltage includes generating the drive voltage based at least in part on the second control signal. For example, the method is implemented according to at least FIG. 2.

As an example, the outputting the drive current to a first terminal of a first transistor includes outputting the drive current to turn on or turn off the first transistor; and the outputting the drive voltage to a fourth terminal of a second transistor includes outputting the drive voltage to turn on or turn off the second transistor. For example, the first transistor is a bipolar transistor; the first terminal of the first transistor is a base terminal; the second terminal of the first transistor is a collector terminal; the third terminal of the first transistor is an emitter terminal; the drive current is a base current; and the first voltage of the first terminal of the first transistor is a base voltage of the base terminal of the bipolar transistor. As an example, the second transistor is a MOS transistor; the fourth terminal of the second transistor is a gate terminal; the fifth terminal of the second transistor is a drain terminal; the sixth terminal of the second transistor is a source terminal; and the drive voltage is a gate voltage. For example, the changing the detection signal from a first logic level to a second logic level based at least in part on the first voltage includes: in response to the first voltage of the first terminal of the first transistor becoming smaller than a second voltage, changing the detection signal from the first logic level to the second logic level to indicate an end of a demagnetization process related to an inductor associated with the first transistor. As an example, the first logic level is a logic low level; and the second logic level is a logic high level.

For example, some or all components of various embodiments of the present invention each are, individually and/or in combination with at least another component, implemented using one or more software components, one or more hardware components, and/or one or more combinations of software and hardware components. As an example, some or all components of various embodiments of the present invention each are, individually and/or in combination with at least another component, implemented in one or more circuits, such as one or more analog circuits and/or one or more digital circuits. For example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments.

What is claimed is:

1. A controller for a power converter, the controller comprising:
    a first driver configured to generate a drive current and output the drive current to a first terminal of a first transistor, the first transistor further including a second terminal and a third terminal;
    a second driver configured to generate a drive voltage and output the drive voltage to a fourth terminal of a second transistor, the second transistor further including a fifth terminal and a sixth terminal;
    a demagnetization detector configured to receive a first voltage of the first terminal of the first transistor and generate a detection signal based at least in part on the first voltage; and
    a control signal generator configured to receive the detection signal and generate a first control signal and a second control signal based at least in part on the detection signal;
    wherein the demagnetization detector is further configured to change the detection signal from a first logic level to a second logic level based at least in part on the first voltage;
    wherein:
        the first driver is further configured to receive the first control signal and generate the drive current based at least in part on the first control signal; and
        the gate driver is further configured to receive the second control signal and generate the drive voltage based at least in part on the second control signal.

2. The controller of claim 1 wherein:
    the first driver is further configured to output the drive current to turn on or turn off the first transistor; and the second driver is further configured to output the drive voltage to turn on or turn off the second transistor.

3. The controller of claim 1 wherein:
the first transistor is a bipolar transistor;
the first terminal of the first transistor is a base terminal;
the second terminal of the first transistor is a collector terminal;
the third terminal of the first transistor is an emitter terminal;
the drive current is a base current; and
the first voltage of the first terminal of the first transistor is a base voltage of the base terminal of the bipolar transistor.

4. The controller of claim 3 wherein the first driver is further configured to generate the base current and output the base current to the base terminal of the bipolar transistor to turn on or turn off the bipolar transistor.

5. The controller of claim 3 wherein:
the second transistor is a MOS transistor;
the fourth terminal of the second transistor is a gate terminal;
the fifth terminal of the second transistor is a drain terminal;
the sixth terminal of the second transistor is a source terminal; and
the drive voltage is a gate voltage.

6. The controller of claim 5 wherein the second driver is further configured to generate the gate voltage and output the gate voltage to the gate terminal of the MOS transistor to turn on or turn off the MOS transistor.

7. The controller of claim 5 wherein the demagnetization detector is further configured to:
receive the base voltage of the base terminal of the bipolar transistor; and
change the detection signal from the first logic level to the second logic level to indicate an end of a demagnetization process.

8. The controller of claim 5, and further comprising the MOS transistor as the second transistor including the gate terminal, the drain terminal, and the source terminal.

9. The controller of claim 8 wherein:
the drain terminal of the MOS transistor is connected to the emitter terminal of the bipolar transistor as the first transistor; and
the collector terminal of the bipolar transistor is connected to an inductor.

10. The controller of claim 9 wherein the demagnetization detector is further configured to:
receive the base voltage of the base terminal of the bipolar transistor; and
change the detection signal from the first logic level to the second logic level to indicate an end of a demagnetization process related to the inductor.

11. The controller of claim 1 wherein the demagnetization detector is further configured to:
in response to the first voltage of the first terminal of the first transistor becoming smaller than a second voltage, change the detection signal from the first logic level to the second logic level to indicate an end of a demagnetization process related to an inductor associated with the first transistor.

12. The controller of claim 11 wherein:
the first logic level is a logic low level; and
the second logic level is a logic high level.

13. A controller for a power converter, the controller comprising:

a first controller terminal configured to output a base current to a base terminal of a bipolar transistor, the bipolar transistor further including a collector terminal and an emitter terminal, the collector terminal being connected to an inductor;
a second controller terminal configured to connect the emitter terminal of the bipolar transistor to a drain terminal of a MOS transistor;
the MOS transistor further including a gate terminal and a source terminal;
a third controller terminal configured to connect the source terminal of the MOS transistor to a resistor; and
a demagnetization detector configured to receive a base voltage of the base terminal of the bipolar transistor through the first controller terminal and generate a detection signal based at least in part on the base voltage;
wherein the demagnetization detector is further configured to, in response to the base voltage becomes smaller than a reference voltage, change the detection signal from a first logic level to a second logic level to indicate an end of a demagnetization process related to the inductor.

14. The controller of claim 13 wherein the first controller terminal is further configured to output the base current to the base terminal of the bipolar transistor to turn on or turn off the bipolar transistor.

15. The controller of claim 13, and further comprising:
a base driver configured to generate the base current;
a gate driver configured to generate a gate voltage and output the gate voltage to the gate terminal of the MOS transistor; and
a control signal generator configured to receive the detection signal and generate a first control signal and a second control signal based at least in part on the detection signal.

16. The controller of claim 15 wherein the gate driver is further configured to output the gate voltage to the gate terminal of the MOS transistor to turn on or turn off the MOS transistor.

17. The controller of claim 13 wherein:
the first logic level is a logic low level; and
the second logic level is a logic high level.

18. A method for a power converter, the method comprising:
generating a drive current;
outputting the drive current to a first terminal of a first transistor, the first transistor further including a second terminal and a third terminal;
generating a drive voltage;
outputting the drive voltage to a fourth terminal of a second transistor, the second transistor further including a fifth terminal and a sixth terminal;
receiving a first voltage of the first terminal of the first transistor;
generating a detection signal based at least in part on the first voltage;
receiving the detection signal; and
generating a first control signal and a second control signal based at least in part on the detection signal;
wherein the generating a detection signal based at least in part on the first voltage includes changing the detection signal from a first logic level to a second logic level based at least in part on the first voltage;

wherein:
the generating a drive current includes generating the drive current based at least in part on the first control signal; and
the generating a drive voltage includes generating the drive voltage based at least in part on the second control signal.

19. The method of claim 18 wherein:
the outputting the drive current to a first terminal of a first transistor includes outputting the drive current to turn on or turn off the first transistor; and
the outputting the drive voltage to a fourth terminal of a second transistor includes outputting the drive voltage to turn on or turn off the second transistor.

20. The method of claim 18 wherein:
the first transistor is a bipolar transistor;
the first terminal of the first transistor is a base terminal;
the second terminal of the first transistor is a collector terminal;
the third terminal of the first transistor is an emitter terminal;
the drive current is a base current; and
the first voltage of the first terminal of the first transistor is a base voltage of the base terminal of the bipolar transistor.

21. The method of claim 20 wherein:
the second transistor is a MOS transistor;
the fourth terminal of the second transistor is a gate terminal;
the fifth terminal of the second transistor is a drain terminal;
the sixth terminal of the second transistor is a source terminal; and
the drive voltage is a gate voltage.

22. The method of claim 18 wherein the changing the detection signal from a first logic level to a second logic level based at least in part on the first voltage includes:
in response to the first voltage of the first terminal of the first transistor becoming smaller than a second voltage, changing the detection signal from the first logic level to the second logic level to indicate an end of a demagnetization process related to an inductor associated with the first transistor.

23. The method of claim 22 wherein:
the first logic level is a logic low level; and
the second logic level is a logic high level.

* * * * *